(12) United States Patent
Ning et al.

(10) Patent No.: US 11,710,443 B2
(45) Date of Patent: Jul. 25, 2023

(54) SHIFT REGISTER, GATE DRIVE CIRCUIT AND DISPLAY PANEL

(71) Applicants: Chongqing BOE Optoelectronics Technology Co., Ltd., Chongqing (CN); BOE TECHNOLOGY GROUP CO., LTD., Beijing (CN)

(72) Inventors: Zhiyong Ning, Beijing (CN); Zhonghao Huang, Beijing (CN); Xu Wu, Beijing (CN); Kunkun Gao, Beijing (CN); Chao Zhang, Beijing (CN); Can Wang, Beijing (CN); Maokun Tian, Beijing (CN)

(73) Assignees: Chongqing BOE Optoelectronics Technology Co., Ltd., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/551,368

(22) Filed: Dec. 15, 2021

(65) Prior Publication Data

US 2022/0293035 A1 Sep. 15, 2022

(30) Foreign Application Priority Data

Mar. 9, 2021 (CN) .......................... 202110256364.6

(51) Int. Cl.
*G09G 3/20* (2006.01)
*G11C 19/28* (2006.01)

(52) U.S. Cl.
CPC .......... *G09G 3/2092* (2013.01); *G11C 19/28* (2013.01); *G09G 2300/0842* (2013.01); *G09G 2310/0286* (2013.01)

(58) Field of Classification Search
CPC ......... G09G 3/2092; G09G 2300/0842; G09G 2310/0286; G09G 2310/0267; G09G 3/20; G11C 19/28
See application file for complete search history.

(56) References Cited

U.S. PATENT DOCUMENTS

| 2011/0298771 A1* | 12/2011 | Yoo .......................... G09G 3/20 345/211 |
| 2014/0225882 A1* | 8/2014 | Wu .......................... G09G 3/20 345/212 |
| 2017/0108989 A1* | 4/2017 | Gu .......................... G06F 3/0412 |
| 2018/0190180 A1* | 7/2018 | Shang .................... G11C 19/28 |

(Continued)

*Primary Examiner* — Jose R Soto Lopez
(74) *Attorney, Agent, or Firm* — Houtteman Law LLC

(57) ABSTRACT

A shift register, a gate drive circuit, and a display panel are provided. The shift register includes an input sub-circuit configured to pre-charge a pull-up node using an input signal; an output sub-circuit configured to output a clock signal through an signal output terminal; a pull-down control sub-circuit configured to control a potential of a pull-down node using a power supply voltage signal; a first pull-down sub-circuit configured to pull down a potential of the pull-down node using a first preset voltage signal; and a first control sub-circuit configured to control the potential of the pull-up node using a second preset voltage signal in response to the potential of the pull-down node; a potential of the first preset voltage signal is lower than a potential of a non-operating level signal of the first pull-down sub-circuit, but higher than a potential of the second preset voltage signal.

18 Claims, 2 Drawing Sheets

(56) References Cited

U.S. PATENT DOCUMENTS

| | | | |
|---|---|---|---|
| 2018/0197448 A1* | 7/2018 | Zhang | G09G 3/20 |
| 2018/0211606 A1* | 7/2018 | Zhang | G09G 3/36 |
| 2019/0066617 A1* | 2/2019 | Zhao | G11C 19/287 |
| 2019/0189233 A1* | 6/2019 | Su | G09G 3/20 |
| 2019/0236994 A1* | 8/2019 | Feng | G09G 3/20 |
| 2020/0020410 A1* | 1/2020 | Du | G11C 19/28 |
| 2020/0090610 A1* | 3/2020 | Wang | G11C 19/28 |
| 2020/0090611 A1* | 3/2020 | Han | G09G 3/3696 |
| 2020/0105357 A1* | 4/2020 | Xie | G09G 3/3677 |
| 2020/0135287 A1* | 4/2020 | Han | G09G 3/3677 |
| 2020/0227127 A1* | 7/2020 | Hou | G11C 19/28 |
| 2020/0243034 A1* | 7/2020 | Gu | G09G 3/3677 |
| 2020/0258464 A1* | 8/2020 | Wang | H04M 1/0266 |
| 2020/0273417 A1* | 8/2020 | Zhao | G09G 3/3614 |
| 2020/0388201 A1* | 12/2020 | Wang | G09G 3/20 |
| 2021/0065643 A1* | 3/2021 | Zheng | G09G 3/3677 |
| 2021/0082328 A1* | 3/2021 | Feng | G09G 3/20 |
| 2021/0193006 A1* | 6/2021 | Wang | G09G 3/20 |
| 2021/0233476 A1* | 7/2021 | Yuan | G11C 19/28 |
| 2021/0241708 A1* | 8/2021 | Pu | G11C 19/28 |
| 2021/0335175 A1* | 10/2021 | Mi | G11C 19/28 |
| 2021/0335200 A1* | 10/2021 | Yuan | G09G 3/3677 |
| 2021/0335202 A1* | 10/2021 | Feng | G11C 19/28 |
| 2021/0335317 A1* | 10/2021 | Liu | G09G 3/3696 |
| 2021/0343224 A1* | 11/2021 | Wang | G09G 3/20 |
| 2022/0005400 A1* | 1/2022 | Feng | G09G 3/2092 |

* cited by examiner

US 11,710,443 B2

SHIFT REGISTER, GATE DRIVE CIRCUIT AND DISPLAY PANEL

CROSS-REFERENCE TO RELATED APPLICATION

This application claims priority to Chinese Patent Application No. 202110256364.6, filed on Mar. 9, 2021, the entire contents of which are hereby incorporated by reference.

TECHNICAL FIELD

The present disclosure relates to the field of display technology, and particularly relates to a shift register, a gate drive circuit, and a display panel.

BACKGROUND

GOA (Gate Driver on Array) technology can replace a drive chip implemented by an external silicon chip by integrating a gate drive circuit on an array substrate of a display panel, so that space occupied by a gate IC (integrated circuit) and fan-out wirings can be omitted to simplify the structure of a display product.

When a TFT (Thin Film Transistor) in GOA operates at a positive or negative bias for a long time, a positive or negative shift of Vth (threshold voltage) of the TFT may occur. Currently, TFT devices in GOA are generally designed to adopt 0V leakage control. When a TFT device initially operates, Vth of the TFT may be negative. For a certain TFT device whose gate coupled to a pull-up node, it is at a negative bias for a long time, and a negative shift of Vth may occur. In the current 0V leakage design, when Vth of a TFT device is less than or close to 0V, leakage may occur in the TFT device, so that operating stability of the GOA may be affected, an actual output signal from a signal output terminal is ultimately affected, and display effect of the display panel may be affected.

SUMMARY

In a first aspect, embodiments of the present disclosure provide a shift register including: an input sub-circuit, an output sub-circuit, at least one pull-down control sub-circuit, at least one first pull-down sub-circuit, and at least one first control sub-circuit;

the input sub-circuit is coupled to a signal input terminal and a pull-up node, and is configured to pre-charge, in response to an input signal provided by the signal input terminal, the pull-up node by using the input signal; the pull-up node is a connection node between the input sub-circuit, the output sub-circuit and the first pull-down sub-circuit;

the output sub-circuit is coupled to the pull-up node, a clock signal terminal and a signal output terminal, and is configured to output a clock signal provided by the clock signal terminal through the signal output terminal in response to a potential of the pull-up node;

the pull-down control sub-circuit is coupled to a power supply voltage terminal and a pull-down node, and is configured to control, in response to a power supply voltage signal provided by the power supply voltage terminal, a potential of the pull-down node by using the power supply voltage signal; the pull-down node is a connection node between the pull-down control sub-circuit and the first pull-down sub-circuit;

the first pull-down sub-circuit is coupled to the pull-up node, a first preset voltage terminal, and the pull-down node, and is configured to pull down the potential of the pull-down node by using a first preset voltage signal provided by the first preset voltage terminal in response to the potential of the pull-up node; and the first control sub-circuit is coupled to the pull-down node, a second preset voltage terminal, and the pull-up node, and is configured to control the potential of the pull-up node by using a second preset voltage signal provided by the second preset voltage terminal in response to the potential of the pull-down node; a potential of the first preset voltage signal is lower than a potential of a non-operating level signal of the first pull-down sub-circuit, and a potential of the second preset voltage signal is lower than the potential of the first preset voltage signal.

In some embodiments, the first pull-down sub-circuit includes: a sixth transistor, and the first control sub-circuit includes: a twelfth transistor;

the sixth transistor has a control electrode coupled to the pull-up node and a second electrode of the twelfth transistor, a first electrode coupled to the first preset voltage terminal, and a second electrode coupled to the pull-down node; and the twelfth transistor has a control electrode coupled to the pull-down node, a first electrode coupled to the second preset voltage terminal, and the second electrode coupled to the control electrode of the sixth transistor and the pull-up node.

In some embodiments, the shift register further includes: at least one second pull-down sub-circuit and at least one second control sub-circuit;

the second pull-down sub-circuit is coupled to the signal input terminal, the first preset voltage terminal, and the pull-down node, and is configured to pull down the potential of the pull-down node by using the first preset voltage signal provided by the first preset voltage terminal in response to the input signal provided by the signal input terminal; and the second control sub-circuit is coupled to the pull-down node, the second preset voltage terminal, and the signal input terminal, and is configured to control a potential of the signal input terminal by using the second preset voltage signal provided by the second preset voltage terminal in response to the potential of the pull-down node.

In some embodiments, the second pull-down sub-circuit includes: a seventh transistor, and the second control sub-circuit includes: a thirteenth transistor;

the seventh transistor has a control electrode coupled to the signal input terminal and a second electrode of the thirteenth transistor, a first electrode coupled to the first preset voltage terminal, and a second electrode coupled to the pull-down node; and the thirteenth transistor has a control electrode coupled to the pull-down node, a first electrode coupled to the second preset voltage terminal, and the second electrode coupled to the control electrode of the seventh transistor and the signal input terminal.

In some embodiments, the shift register further includes: at least one first noise reduction sub-circuit and at least one second noise reduction sub-circuit;

the first noise reduction sub-circuit is coupled to the pull-down node, a non-operating level signal terminal, and the pull-up node, and is configured to denoise the potential of the pull-up node by using a non-operating level signal provided by the non-operating level signal terminal in response to the potential of the pull-down node;

the second noise reduction sub-circuit is coupled to the pull-down node, the non-operating level signal terminal, and the signal output terminal, and is configured to denoise a potential of the signal output terminal by using the non-operating level signal provided by the non-operating level signal terminal in response to the potential of the pull-down node.

In some embodiments, the first noise reduction sub-circuit includes: an eighth transistor, and the second noise reduction sub-circuit includes: a tenth transistor and an eleventh transistor;

the eighth transistor has a control electrode coupled to the pull-down node, a first electrode coupled to the non-operating level signal terminal, and a second electrode coupled to the pull-up node;

the tenth transistor has a control electrode coupled to the pull-down node, a first electrode coupled to the non-operating level signal terminal, and a second electrode coupled to a cascade signal output terminal; and the eleventh transistor has a control electrode coupled to the pull-down node, a first electrode coupled to the non-operating level signal terminal, and a second electrode coupled to the signal output terminal.

In some embodiments, the shift register further includes: a first reset sub-circuit and a second reset sub-circuit;

the first reset sub-circuit is coupled to a reset signal terminal, a non-operating level signal terminal, and the pull-up node, and is configured to reset the potential of the pull-up node by using a non-operating level signal provided by the non-operating level signal terminal in response to a potential of a reset signal provided by the reset signal terminal; and the second reset sub-circuit is coupled to the reset signal terminal, the non-operating level signal terminal, and the signal output terminal, and is configured to reset a potential of the signal output terminal by using the non-operating level signal provided by the non-operating level signal terminal in response to the potential of the reset signal provided by the reset signal terminal.

In some embodiments, the first reset sub-circuit includes: a second transistor, and the second reset sub-circuit includes: a fourth transistor;

the second transistor has a control electrode coupled to the reset signal terminal, a first electrode coupled to the non-operating level signal terminal, and a second electrode coupled to the pull-up node;

the fourth transistor has a control electrode coupled to the reset signal terminal, a first electrode coupled to the non-operating level signal terminal, and a second electrode coupled to the signal output terminal.

In some embodiments, the input sub-circuit includes: a first transistor;

the first transistor has a control electrode and a first electrode both coupled to the signal input terminal, and a second electrode coupled to the pull-up node.

In some embodiments, the output sub-circuit includes: a third transistor, a ninth transistor, and a storage capacitor;

the third transistor has a control electrode coupled to the pull-up node, a first electrode coupled to the clock signal terminal, and a second electrode coupled to the signal output terminal;

the ninth transistor has a control electrode coupled to the pull-up node, a first electrode coupled to the clock signal terminal, and a second electrode coupled to a cascade signal output terminal; and the storage capacitor has a first terminal coupled to the pull-up node, and a second terminal coupled to the signal output terminal.

In some embodiments, the pull-down control sub-circuit includes: a fifth transistor;

the fifth transistor has a control electrode and a first electrode both coupled to the power supply voltage terminal, and a second electrode coupled to the pull-down node.

In some embodiments, numbers of the at least one pull-down control sub-circuit, the at least one first pull-down sub-circuit, and the at least one first control sub-circuit are equal.

In some embodiments, numbers of the at least one pull-down control sub-circuit, the at least one first pull-down sub-circuit, the at least one first control sub-circuit, the at least one second pull-down sub-circuit and the at least one second control sub-circuit are equal.

In some embodiments, numbers of the at least one pull-down control sub-circuit, the at least one first pull-down sub-circuit, the at least one first control sub-circuit, the at least one second pull-down sub-circuit, the at least one second control sub-circuit, the at least one first noise reduction sub-circuit and the at least one second noise reduction sub-circuit are equal.

In some embodiments, the numbers of the at least one pull-down control sub-circuit, the at least one first pull-down sub-circuit, the at least one first control sub-circuit, the at least one second pull-down sub-circuit, the at least one second control sub-circuit, the at least one first noise reduction sub-circuit and the at least one second noise reduction sub-circuit are all two.

In some embodiments, the two pull-down control sub-circuits operate asynchronously.

In a second aspect, embodiments of the present disclosure provide a gate drive circuit including a plurality of shift registers that are cascaded, and each shift register being the shift register described above;

the signal input terminal of a shift register of a current stage is coupled to the signal output terminal of a shift register of a previous stage; and the signal output terminal of the shift register of the current stage is coupled to a reset signal terminal of a shift register of a next stage.

In a third aspect, embodiments of the present disclosure provide a display panel including the gate drive circuit as described above.

DETAIL DESCRIPTION OF EMBODIMENTS

Figure 1:
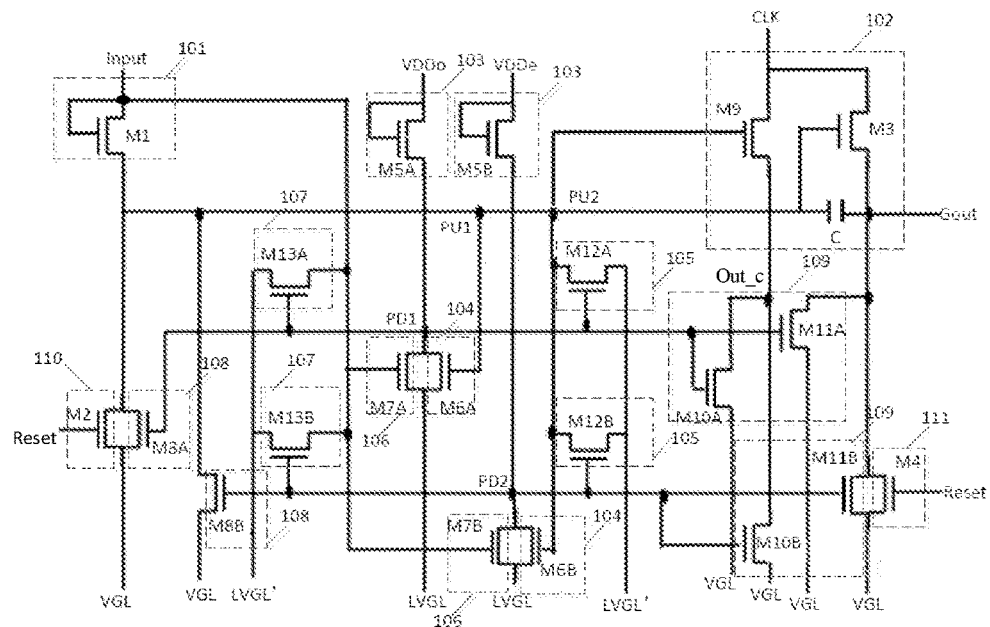
FIG. 1 is a schematic structural diagram of a shift register provided by an embodiment of the present disclosure.

In order to enable those skilled in the art to better understand the technical solutions of the present disclosure, the present disclosure will be further described in detail below with reference to the accompanying drawings and specific embodiments.

Unless otherwise defined, the technical or scientific terms used in the present disclosure shall have the usual meanings understood by those with ordinary skills in the field to which this disclosure belongs. The words such as "first", "second", and the like used in the present disclosure do not indicate any order, quantity or importance, but are only used to distinguish different components. Similarly, the words such as "a", "one" or "the" do not mean quantity limitation, but mean that there is at least one. The words such as "include", "comprise" and the like mean that the element or item appearing before the word encompasses the element or item listed after the word and its equivalents, but do not exclude other elements or items. The words such as "couple", "connect" and the like are not limited to physical or mechanical connections, but may include electrical connections, whether direct or indirect. The words such as "up", "down", "left", "right", and the like are only used to indicate the relative position relationship, and when the absolute position of the described object changes, the relative position relationship may also change accordingly.

An existing display panel generally has a display area and a peripheral area surrounding the display area; a plurality of pixel units arranged in an array are provided in the display area, and each pixel unit is provided with a pixel circuit. Pixel units located in a same row are coupled to a same gate line, and pixel units located in a same column are coupled to a same data line. A gate drive circuit is provided in the peripheral area, and the gate drive circuit includes a plurality of shift registers that are cascaded, the shift registers and the gate lines are arranged in a one-to-one correspondence, that is, each shift register is coupled to one gate line. When displaying each frame, the shift registers output gate scanning signals to the corresponding gate lines one by one, so as to complete progressive scanning of the pixel circuits. While scanning each gate line, data voltage signals are written into pixel circuits coupled to this gate line to light up the pixel units in the row, thus realizing display of the entire display panel.

It should be noted here that transistors used in the embodiments of the present disclosure may be thin film transistors or field effect transistors or other devices with similar characteristics. Since the source and the drain of the used transistor are symmetrical, there is no difference between the source and the drain. In the embodiments of the present disclosure, in order to distinguish the source and the drain of the transistor, one of the electrodes is called a first electrode, the other is called a second electrode, and the gate is called a control electrode. In addition, transistors may be divided into N-type transistors and P-type transistors according to their characteristics. The following embodiments are described by taking N-type transistors as an example. In the case of using an N-type transistor, the first electrode is the source of the N-type transistor, the second electrode is the drain of the N-type transistor, the source and the drain are conducted when the gate is supplied with a high level, and the opposite is true for a P-type transistor. It is conceivable that the implementation with P-type transistors can be easily conceived by those skilled in the art without creative efforts, and therefore it is also within the protection scope of the embodiments of the present disclosure. Since the transistors used in the embodiments of the present disclosure are N-type transistors, an operating level signal in the embodiments of the present disclosure refers to a high-level signal, and a non-operating level signal refers to a low-level signal; correspondingly, an operating level signal terminal is a high-level signal terminal, and a non-operating level signal terminal is a low-level signal terminal.

In a first aspect, an embodiment of the present disclosure provides a shift register. FIG. 1 is a schematic structural diagram of a shift register provided by an embodiment of the present disclosure. As shown in FIG. 1, the shift register includes: an input sub-circuit 101, an output sub-circuit 102, at least one pull-down control sub-circuit 103, at least one first pull-down sub-circuit 104, and at least one first control sub-circuit 105. The input sub-circuit 101 is coupled to a signal input terminal Input and a pull-up node PU, and is configured to pre-charge, in response to an input signal from the signal input terminal Input, the pull-up node PU by using the input signal. The pull-up node PU is a connection node between the input sub-circuit 101, the output sub-circuit 102, and the first pull-down sub-circuit 104. The output sub-circuit 102 is coupled to the pull-up node PU, a clock signal terminal CLK, and a signal output terminal Gout, and is configured to output a clock signal input from the clock signal terminal CLK through the signal output terminal Gout in response to a potential of the pull-up node PU. The pull-down control sub-circuit 103 is coupled to a power supply voltage terminal and a pull-down node PD, and is configured to control, in response to a power supply voltage signal provided by the power supply voltage terminal, a potential of the pull-down node PD by using the power supply voltage signal; the pull-down node PD is a connection node between the pull-down control sub-circuit 103 and the first pull-down sub-circuit 104. The first pull-down sub-circuit 104 is coupled to the pull-up node PU, the pull-down node PD, and a first preset voltage terminal LVGL, and is configured to pull down the potential of the pull-down node PD by using a first preset voltage signal provided by the first preset voltage terminal LVGL in response to the potential of the pull-up node PU. The first control sub-circuit 105 is coupled to the pull-down node PD, the pull-up node P, and a second preset voltage terminal LVGL', and is configured to control the potential of the pull-up node PU by using a second preset voltage signal provided by the second preset voltage terminal LVGL' in response to the potential of the pull-down node PD. A potential of the first preset voltage signal is lower than a potential of a non-operating level signal of the first pull-down sub-circuit 104, and a potential of the second preset voltage signal is lower than the potential of the first preset voltage signal.

It should be noted here that the shift register provided by the embodiments of the present disclosure may include at least one pull-down control sub-circuit 103, at least one first pull-down sub-circuit 104, and at least one first control sub-circuit 105, and the numbers of the at least one pull-down control sub-circuit 103, the at least one first pull-down sub-circuit 104, and the at least one first control sub-circuit 105 may be equal. Thereinafter, descriptions are given by taking a case where the shift register includes two pull-down control sub-circuits 103, two first pull-down sub-circuits 104 and two first control sub-circuits 105 as an example. Accordingly, the number of the pull-up nodes PU is also two, namely PU1 and PU2, the number of the pull-down nodes PD is also two, namely PD1 and PD2. By taking a case of two pull-down control sub-circuits 103 as an example, the two pull-down control sub-circuits 103 have the same operating principle, and may operate at different times to reduce workload of transistors in the pull-down control sub-circuits 103, thereby improving service life of the transistors.

In the shift register provided by the embodiments of the present disclosure, when the first pull-down sub-circuit 104 operates, the potential of the pull-up node PU is a high-level potential, and the first pull-down sub-circuit 104 can transmit a first preset voltage signal provided by the first preset voltage terminal LVGL to the pull-down node PD to pull down the potential of the pull-down node PD under the control of the potential of the pull-up node PU. When the first pull-down sub-circuit 104 does not operate, the potential of the pull-down node PD is a high-level potential (under the control of the pull-down control sub-circuit 103), and the first control sub-circuit 105 can operate under the control of the potential of the pull-down node PD, and input a second preset voltage signal provided by the second preset voltage terminal LVGL' to the pull-up node PU, so that the potential of the pull-up node PU is the potential of the second preset voltage signal. Because the potential of the second preset voltage signal is lower than the potential of the non-operating level signal (low-level signal) of the first pull-down sub-circuit 104, the transistor in the first pull-down sub-circuit 104 can be completely turned off, so as to prevent leakage current. Moreover, the input signal and the control signal in the first pull-down sub-circuit 104 are the first preset voltage signal and the second preset voltage signal, respectively, and because the potential of the second preset voltage signal is lower than that of the first preset voltage signal, there is a certain voltage difference between the first and second preset voltage signals, which can cause the transistor in the first pull-down sub-circuit 104 to be turned off completely to prevent leakage current even if Vth of the transistor in the first pull-down sub-circuit 104 is negatively shifted, and Vth is less than or close to 0V. It can be seen that in the shift register provided by the embodiments of the present disclosure, with the first control sub-circuit 105 in conjunction with the first preset voltage signal and the second preset voltage signal, some transistors (for example, the transistors in the first pull-down sub-circuits 104) in the shift register can be prevented from generating leakage current, and influence of the leakage current on an actual output signal from the signal output terminal Gout can be avoided. Therefore, operation stability of the shift register can be ensured, and display effect of the display panel can be improved.

It should be noted here that the specific operating process of the shift register provided in the embodiments of the present disclosure will be described in detail below in conjunction with a timing diagram, and will not be repeated here.

In some embodiments, as shown in FIG. 1, the first pull-down sub-circuit 104 includes: a sixth transistor M6; the first control sub-circuit 105 includes: a twelfth transistor M12. A gate of the sixth transistor M6 is coupled to the pull-up node PU and a drain of the twelfth transistor M12, a source of the sixth transistor M6 is coupled to the first preset voltage terminal LVGL, and a drain of the sixth transistor M6 is coupled to the pull-down node PD. A gate of the twelfth transistor M12 is coupled to the pull-down node PD, a source of the twelfth transistor M12 is coupled to the second preset voltage terminal LVGL', and the drain of the twelfth transistor M12 is coupled to the gate of the sixth transistor M6 and the pull-up node PU.

In an embodiment of the present disclosure, the number of the first pull-down sub-circuits 104 is two, and the number of the first control sub-circuits 105 is two. Accordingly, the number of the sixth transistors M6 is two, and one of the two sixth transistors M6 is represented by M6A, and the other of the two sixth transistors M6 is represented by M6B; the number of the twelfth transistors M12 is two, one of the two twelfth transistors M12 is represented by M12A, and the other of the two twelfth transistors M12 is represented by M12B.

When the sixth transistor M6 operates, the potential of the pull-up node PU is a high-level potential, and the sixth transistor M6 can transmit the first preset voltage signal to the pull-down node PD to pull down the potential of the pull-down node PD under the control of the potential of the pull-up node PU. When the sixth transistor M6 does not operate, the potential of the pull-down node PD is a high-level potential, and the twelfth transistor M12 can be turned on under the control of the potential of the pull-down node PD, and transmit the second preset voltage signal to the pull-up node PU, so that the potential of the pull-up node PU is the potential of the second preset voltage signal. Because the potential of the second preset voltage signal is lower than that of the non-operating level signal (low-level signal) of the sixth transistor M6, the sixth transistor M6 can be completely turned off to prevent leakage current. Moreover, the signals input to the source and gate of the sixth transistor M6 are the first preset voltage signal and the second preset voltage signal, respectively, and because the potential of the second preset voltage signal is lower than the potential of the first preset voltage signal, there is a certain voltage difference between the first and second preset voltage signals, which can cause the sixth transistor M6 to be completely turned off to prevent leakage current even if Vth of the sixth transistor M6 is negatively shifted, and Vth is less than or close to 0V. It can be seen that in the shift register provided by the embodiment of the present disclosure, with the twelfth transistor M12 in conjunction with the first preset voltage signal and the second preset voltage signal, the sixth transistors M6 in the shift register can be prevented from generating leakage current, and influence of the leakage current on an actual output signal from the signal output terminal Gout can be avoided. Therefore, operation stability of the shift register can be ensured, and display effect of the display panel can be improved.

In some embodiments, as shown in FIG. 1, the shift register further includes: at least one second pull-down sub-circuit 106 and at least one second control sub-circuit 107. The second pull-down sub-circuit 106 is coupled to the signal input terminal Input, the first preset voltage terminal LVGL, and the pull-down node PD, and is configured to pull down the potential of the pull-down node PD by using the first preset voltage signal provided by the first preset voltage terminal LVGL in response to an input signal from the signal input terminal Input. The second control sub-circuit 107 is coupled to the pull-down node PD, the second preset voltage terminal LVGL' and the signal input terminal Input, and is configured to control the potential of the signal input terminal Input through the second preset voltage signal provided by the second preset voltage terminal LVGL' in response to the potential of the pull-down node PD.

It should be noted here that the shift register provided by the embodiment of the present disclosure may include at least one second pull-down sub-circuit 106 and at least one second control sub-circuit 107, and numbers of the at least one second pull-down sub-circuit 106 and the at least one second control sub-circuit 107 may be equal to the numbers of the at least one pull-down control sub-circuit 103, the at least one first pull-down sub-circuit 104, and the at least one first control sub-circuit 105. The following description will be given by taking a case where the shift register includes two second pull-down sub-circuits 106 and two second control sub-circuits 107 as an example.

In the shift register provided by an embodiment of the present disclosure, when the second pull-down sub-circuit 106 operates, the potential of the input signal from the signal input terminal Input is a high-level potential, and the second pull-down sub-circuit 106 can transmit the first preset voltage signal to the pull-down node PD to pull down the potential of the pull-down node PD under the control of the input signal from the signal input terminal Input. The second pull-down sub-circuit 106 can assist the first pull-down sub-circuit 104 to quickly pull down the potential of the pull-down node PD, so as to increase the service life of the first pull-down sub-circuit 104. When the second pull-down sub-circuit 106 does not operate, the potential of the pull-down node PD is a high-level potential, and the second control sub-circuit 107 can operate under the control of the potential of the pull-down node PD and input the second preset voltage signal to the signal input terminal Input, so that the potential of the signal input terminal Input is the potential of the second preset voltage signal. Because the potential of the second preset voltage signal is lower than the potential of the non-operating level signal (low-level signal) of the second pull-down sub-circuit 106, the transistor in the second pull-down sub-circuit 106 can be completely turned off to prevent leakage current. Moreover, the input signal and the control signal of the second pull-down sub-circuit 106 are the first preset voltage signal and the second preset voltage signal, respectively, and because the potential of the second preset voltage signal is lower than the potential of the first preset voltage signal, there is a certain voltage difference between the first and second preset voltage signals, which can cause the transistor in the second pull-down sub-circuit 106 to be completely turned off to prevent leakage current even if Vth of the transistor in the second pull-down sub-circuit 106 is negatively shifted and Vth is less than or close to 0V. It can be seen that in the shift register provided by the embodiment of the present disclosure, with the second control sub-circuit 107 in conjunction with the first preset voltage signal and the second preset voltage signal, some transistors (for example, the transistors in the second pull-down sub-circuits 106) in the shift register can be prevented from generating leakage current, and influence of the leakage current on an actual output signal from the signal output terminal Gout can be avoided. Therefore, operation stability of the shift register can be ensured, and display effect of the display panel can be improved.

In some embodiments, as shown in FIG. 1, the second pull-down sub-circuit 106 includes: a seventh transistor M7; the second control sub-circuit 107 includes: a thirteenth transistor M13. A gate of the seventh transistor M7 is coupled to the signal input terminal Input and a drain of the thirteenth transistor M13, a source of the seventh transistor M7 is coupled to the first preset voltage terminal LVGL, and a drain of the seventh transistor M7 is coupled to the pull-down node PD. A gate of the thirteenth transistor M13 is coupled to the pull-down node PD, a source of the thirteenth transistor M13 is coupled to the second preset voltage terminal LVGL', and the drain of the thirteenth transistor M13 is coupled to the gate of the seventh transistor M7 and the signal input terminal Input.

In an embodiment of the present disclosure, the number of the second pull-down sub-circuits 106 is two, and the number of the second control sub-circuits 107 is two. Accordingly, the number of the seventh transistors M7 is two, one of the two seventh transistors M7 is represented by M7A, and the other of the two seventh transistors M7 is represented by M7B; the number of the thirteenth transistors M13 is two, one of the two thirteenth transistors M13 is represented by M13A, and the other of the two thirteenth transistors M13 is represented by M13B.

When the seventh transistor M7 operates, the potential of the input signal from the signal input terminal Input is a high-level potential, and the seventh transistor M7 can transmit the first preset voltage signal to the pull-down node PD to pull down the potential of the pull-down node PD under the control of the input signal from the signal input terminal Input. The seventh transistor M7 can assist the sixth transistor M6 to quickly pull down the potential of the pull-down node PD, so as to increase the service life of the sixth transistor M6. When the seventh transistor M7 does not operate, the potential of the pull-down node PD is a high-level potential, and the thirteenth transistor M13 can operate under the control of the potential of the pull-down node PD, and can transmit the second preset voltage signal to the signal input terminal Input, so that the potential of the signal input terminal Input is the potential of the second preset voltage signal. Because the potential of the second preset voltage signal is lower than the potential of the non-operating level signal (low-level signal) of the seventh transistor M7, the seventh transistor M7 can be completely turned off to prevent leakage current. In addition, the signals input to the source and the gate of the seventh transistor M7 are the first preset voltage signal and the second preset voltage signal, respectively, and because the potential of the second preset voltage signal is lower than that of the first preset voltage signal, there is a certain voltage difference between the first and second preset voltage signals, which can cause the seventh transistor M7 to be completely turned off to prevent leakage current even if Vth of the seventh transistor M7 is negatively shifted and Vth is less than or close to 0V. It can be seen that in the shift register provided by the embodiment of the present disclosure, with the thirteenth transistor M13 in conjunction with the first preset voltage signal and the second preset voltage signal, the seventh transistor M7 in the shift register can be prevented from generating leakage current, and influence of the leakage current on an actual output signal from the signal output terminal Gout can be avoided. Therefore, operation stability of the shift register can be ensured, and display effect of the display panel can be improved.

In some embodiments, as shown in FIG. 1, the shift register further includes: at least one first noise reduction sub-circuit 108 and at least one second noise reduction sub-circuit 109. The first noise reduction sub-circuit 108 is coupled to the pull-down node PD, a non-operating level signal terminal VGL, and the pull-up node PU, and is configured to denoise the potential of the pull-up node PU by using the non-operating level signal provided by the non-operating level signal terminal VGL in response to the potential of the pull-down node PD. The second noise reduction sub-circuit 109 is coupled to the pull-down node PD, the non-operating level signal terminal VGL, and the signal output terminal Gout, and is configured to denoise the potential of the signal output terminal Gout by using the non-operating level signal provided by the non-operating level signal terminal VGL in response to the potential of the pull-down node PD.

In some embodiments, the first noise reduction sub-circuit 108 includes: an eighth transistor M8; the second noise reduction sub-circuit 109 includes: a tenth transistor M10 and an eleventh transistor M11. A gate of the eighth transistor M8 is coupled to the pull-down node PD, a source of the eighth transistor M8 is coupled to the non-operating level signal terminal VGL, and a drain of the eighth transistor M8 is coupled to the pull-up node PU. A gate of the tenth transistor M10 is coupled to the pull-down node PD, a source of the tenth transistor M10 is coupled to the non-operating level signal terminal VGL, and a drain of the tenth transistor M10 is coupled to a cascade signal output terminal Out_c. A gate of the eleventh transistor M11 is coupled to the pull-down node PD, a source of the eleventh transistor M11 is coupled to the non-operating level signal terminal VGL, and a drain of the eleventh transistor M11 is coupled to the signal output terminal Gout. It should be noted that the cascade signal output terminal Out_c is used for transmitting a cascade signal, and the signal output terminal Gout is used for transmitting an output signal to a corresponding gate line.

It should be noted here that the shift register provided by the embodiments of the present disclosure may include at least one first noise reduction sub-circuit 108 and at least one second noise reduction sub-circuit 109, and the numbers of the at least one first noise reduction sub-circuit 108 and the at least one second noise reduction sub-circuit 109 may be equal to the numbers of the at least one pull-down control sub-circuit 103, the at least one first pull-down sub-circuit 104, and the at least one first control sub-circuit 105. The following description will be given by taking a case where the shift register includes two first noise reduction sub-circuits 108 and two second noise reduction sub-circuits 109 as an example. Correspondingly, the numbers of the eighth transistors M8, the tenth transistors M10, and the eleventh transistors M11 are two, one of the two eighth transistors M8 is represented by MBA, the other of the two eighth transistors M8 is represented by M8B, one of the two tenth transistors M10 is represented by M10A, the other of the two tenth transistors M10 is represented by M10B, one of the two eleventh transistors M11 is represented by M11A, and the other of the two eleventh transistors M11 is represented by M11B.

In the embodiments of the present disclosure, when the potential of the pull-down node PD is a high-level potential, the eighth transistor M8 is turned on, and a non-operating level signal (i.e., a low-level signal) can be transmitted to the pull-up node PU to perform noise reduction on the pull-up node PU by using the low-level signal. Therefore, influence of a noise signal of the pull-up node PU on the actual output signal from the signal output terminal Gout can be avoided, and operating stability of the shift register can be ensured, thereby improving the display effect of the display panel. When the potential of the pull-down node PD is a high-level potential, the tenth transistor M10 and the eleventh transistor M11 are turned on, and the non-operating level signal (i.e., low level signal) can be transmitted to the cascade signal output terminal Out_c and the signal output terminal Gout to perform noise reduction on the cascade signal output terminal Out_c and the signal output terminal Gout by using the low-level signal. Therefore, influence of a noise signal of the signal output terminal Gout on the actual output signal output from the signal output terminal Gout can be avoided, and operating stability of the shift register can be ensured, thereby improving the display effect of the display panel.

In some embodiments, as shown in FIG. 1, the shift register further includes: a first reset sub-circuit 110 and a second reset sub-circuit 111. The first reset sub-circuit 110 is coupled to a reset signal terminal Reset, the non-operating level signal terminal VGL and the pull-up node PU, and is configured to reset the potential of the pull-up node PU by using the non-operating level signal provided by the non-operating level signal terminal VGL in response to a potential of a reset signal provided by the reset signal terminal Reset. The second reset sub-circuit 111 is coupled to the reset signal terminal Reset, the non-operating level signal terminal VGL and the signal output terminal Gout, and is configured to reset the potential of the signal output terminal Gout by using the non-operating level signal provided by the non-operating level signal terminal VGL in response to the potential of the reset signal provided by the reset signal terminal Reset.

In some embodiments, the first reset sub-circuit 110 includes: a second transistor M2; the second reset sub-circuit 111 includes: a fourth transistor M4. A gate of the second transistor M2 is coupled to the reset signal terminal Reset, a source of the second transistor M2 is coupled to the non-operating level signal terminal VGL, and a drain of the second transistor M2 is coupled to the pull-up node PU. A gate of the fourth transistor M4 is coupled to the reset signal terminal Reset, a source of the fourth transistor M4 is coupled to the non-operating level signal terminal VGL, and a drain of the fourth transistor M4 is coupled to the signal output terminal Gout.

In the embodiments of the present disclosure, when the potential of the reset signal terminal Reset is a high-level potential, the second transistor M2 is turned on, and a non-operating level signal (i.e., low-level signal) can be transmitted to the pull-up node PU to reset the pull-up node PU by using the low-level signal, so as to ensure that the potential of the pull-up node PU is reset to a low level, which can ensure the operating stability of the shift register when the next frame is displayed, thereby improving the display effect of the display panel. At the same time, when the potential of the reset signal terminal Reset is a high-level potential, the fourth transistor M4 is turned on, and a non-operating level signal (i.e., low-level signal) can be transmitted to the signal output terminal Gout to reset the signal output terminal Gout by using the low-level signal, so as to ensure that the potential of the signal output terminal Gout is reset to a low level potential, which can ensure the operating stability of the shift register when the next frame is displayed, thereby improving the display effect of the display panel.

In some embodiments, as shown in FIG. 1, the input sub-circuit 101 includes: a first transistor M1. A gate and a source of the first transistor M1 are both coupled to the signal input terminal Input, and a drain of the first transistor M1 is coupled to the pull-up node PU. Alternatively, the gate and the source of the first transistor M1 may not be coupled together, but signals are provided to the gate and the source of the first transistor M1 separately, which is not limited in the present disclosure.

When the potential of the input signal provided by the signal input terminal Input is a high-level potential, the first transistor M1 is turned on, and the input signal from the signal input terminal Input can precharge the pull-up node PU, so that the potential of the pull-up node PU is a high-level potential.

In some embodiments, as shown in FIG. 1, the output sub-circuit 102 includes: a third transistor M3, a ninth transistor M9, and a storage capacitor C. A gate of the third transistor M3 is coupled to the pull-up node PU, a source of the third transistor M3 is coupled to the clock signal terminal CLK, and a drain of the third transistor M3 is coupled to the signal output terminal Gout. A gate of the ninth transistor M9 is coupled to the pull-up node PU, a source of the ninth transistor M9 is coupled to the clock signal terminal CLK, and a drain of the ninth transistor M9 is coupled to the cascade signal output terminal Out_c for transmitting a cascade signal. A first terminal of the storage capacitor C is coupled to the pull-up node PU, and a second terminal of the storage capacitor C is coupled to the signal output terminal Gout.

When the potential of the input signal from the input signal terminal Input is a low-level potential, the first transistor M1 is turned off, and the pull-up node PU continues to maintain the high-level potential in the precharge stage. At this time, the third transistor M3 and the ninth transistor M9 are turned on, the clock signal terminal CLK inputs a high-level signal, and the potential of the pull-up node PU is further increased due to the bootstrap effect of the storage capacitor C, so that the third transistor M3 remains on state to cause the signal output terminal Gout to output a high-level signal.

In some embodiments, as shown in FIG. 1, the pull-down control sub-circuit 103 includes: a fifth transistor M5. A gate and a source of the fifth transistor M5 are coupled to a power supply voltage terminal VDD, and a drain of the fifth transistor M5 is coupled to the pull-down node PD.

It should be noted here that the shift register provided by the embodiments of the present disclosure may include two pull-down control sub-circuits 103. Correspondingly, there are two fifth transistors M5, one of the two fifth transistors M5 is represented by M5A, and the other of the two fifth transistors M5 is represented by M5B. The power supply voltage terminals VDD coupled to the two fifth transistors M5A and M5B are represented by VDDo and VDDe, respectively.

When the potential of the signal input from the power supply voltage terminal VDD is a high-level potential, the fifth transistor M5 is turned on, and the signal of the power supply voltage terminal VDD is transmitted to the pull-down node PD, so that the potential of the pull-down node PD is a high-level potential.

Figure 2:
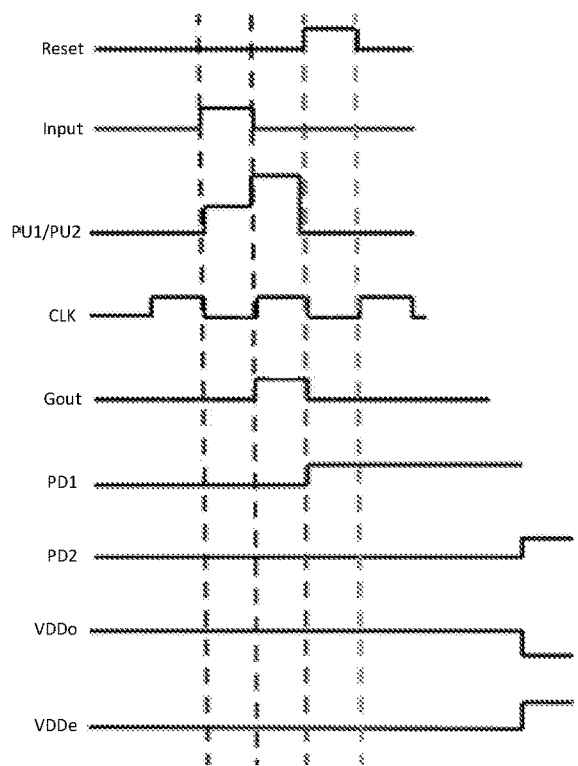
FIG. 2 is a timing diagram of a shift register provided by an embodiment of the present disclosure.

FIG. 2 is a timing diagram of a shift register provided by an embodiment of the present disclosure. The operating process of the shift register provided by the embodiment of the present disclosure will be further described in detail below in conjunction with the timing diagram.

In a first stage, the input signal from the input signal terminal Input is a high-level signal. At this time, the first transistor M1 is turned on, and the pull-up nodes PU1 and PU2 are precharged. Because the signal from the clock signal terminal CLK at this time is a low-level signal, the signal output terminal Gout outputs a low-level signal even if the third transistor M3 is turned on. The potentials of the pull-up nodes PU1 and PU2 are high-level potentials, the signal from the signal input terminal Input is also a high-level signal, the sixth transistors M6A/M6B and the seventh transistors M7A/M7B are both turned on, and the low-level signal from the non-operating level signal terminal VGL is input to the pull-down nodes PD1 and PD2, so that the potentials of the pull-down nodes PD1 and PD2 are low-level potentials.

In a second stage, the clock signal provided by the clock signal terminal CLK is a high-level signal. At this time, the potentials of the pull-up nodes PU1 and PU2 are both high-level potentials, the third transistor M3 and the ninth transistor M9 are both turned on, and the signal output terminal Gout outputs a high-level signal. Due to the bootstrap effect of the capacitor C, the potentials of the pull-up nodes PU1 and PU2 are further increased, so that the third transistor M3 and the ninth transistor M9 are fully turned on, thereby reducing the signal delay and keeping the true signal.

In a third stage, the reset signal provided by the reset signal terminal Reset is a high-level signal. At this time, the second transistor M2 is turned on to discharge the pull-up nodes PU1 and PU2, and the potentials of the pull-up nodes PU1 and PU2 are pulled down to low-level potentials, so that the sixth transistors M6A/M6B are turned off. At this time, the signal input terminal Input also inputs a low-level signal, the seventh transistors M7A/M7B are also turned off, and the fifth transistor M5A is turned on, so the pull-down node PD1 is at a high level, which controls the eighth transistor M8A, the tenth transistor M10A, and the eleventh transistor M11A to be turned on, so that the pull-up nodes PU1 and PU2, the cascade signal output terminal Out_c and the signal output terminal Gout are discharged and pulled down to a low level.

After the above three stages, the shift register (i.e., the shift register coupled to an N-th gate line) can output a complete output signal Gout, which can work with data signals to control charge and discharge of the pixel units.

As described above, the fifth transistors M5A and M5B in the two pull-down control sub-circuits 103 may operate at different times to reduce the workload of the two transistors and increase the service life. Although in the third stage, description is given by taking the case where the fifth transistor M5A is turned on as an example, but it is understood by those skilled in the art that the operating principle is the same when the fifth transistor M5B is turned on. For example, in the third stage, the fifth transistor M5B is turned on, so that the pull-down node PD2 is at a high level, which controls the eighth transistor M8B, the tenth transistor M10B, and the eleventh transistor M11B to be turned on, so that the pull-up nodes PU1 and PU2, the cascade signal output terminal Out_c and the signal output terminal Gout are discharged and pulled down to a low level. In the following, the operating principle when turning on the fifth transistor M5B may refer to the description when turning on the fifth transistor M5A, and will not be repeated.

In the shift register provided by the embodiments of the present disclosure, the inputs of the sixth transistor M6 and the seventh transistor M7 are adjusted respectively by using the twelfth transistor M12 and the thirteenth transistor M13 to make the margins of the transistors larger, thereby improving the product yield and quality. In the second stage, the clock signal terminal CLK inputs a high-level signal, the potentials of the pull-up nodes PU1 and PU2 are both high-level potentials, and the third transistor M3, the ninth transistor M9, and the sixth transistors M6A/M6B are all turned on, the voltage of the gate of the eleventh transistor M11A is the first preset voltage (also referred to as $V_{LVGL}$) provided by the first preset voltage terminal LVGL (the sixth transistor M6A is turned on because the pull-up node PU1 is at a high level, so the voltage of the pull-down node PD1 is $V_{LVGL}$), the voltage of the source of the eleventh transistor M11A is the potential (also referred to as $V_{VGL}$) of the non-operating level signal provided by the non-operating level signal terminal VGL, and $V_{VGL} > V_{LVGL} > V_{LVGL'}$, where $V_{LVGL'}$ is the second preset voltage provided by the second preset voltage terminal LVGL'. In this way, the margin of the eleventh transistor M11A is much larger, and only when $Vth \leq V_{LVGL} - V_{VGL}$, leakage may occur in the eleventh transistor M11A, and VGL signal is transmitted to the signal output terminal Gout. In the third stage, the second transistor M2 is turned on, and the pull-up nodes PU1/PU2 are discharged. At this time, the potentials of the pull-up nodes PU1/PU2 are pulled down to a low level, and the potential of the pull-down node PD1 is a high-level potential, so the tenth transistor M10A, the eleventh transistor M11A, the eighth transistor M8A, the twelfth transistor M12A, and the thirteenth transistor M13A are all turned on. Because the twelfth transistor M12A and the thirteenth transistor M13A are both turned on, the voltage of the gate of the seventh transistor M7A is $V_{LVGL'}$ and the voltage of the source thereof is $V_{LVGL}$; the gate of the sixth transistor M6A is coupled to the pull-up node PU1/PU2, the signal from the second preset voltage signal terminal LVGL' is input to the pull-up node PU1/PU2 as the twelfth transistor M12A is turned on, at this time, the voltage of the gate of the sixth transistor M6A is $V_{LVGL'}$ and the voltage of the source thereof is $V_{LVGL}$. In this way, the potential of the pull-down node PD1 will not be pulled down due to the leakage of the sixth transistor M6A and the seventh transistor M7A (the same is true for the pull-down node PD2), and the signal output from the signal output terminal Gout is normal (even if a coupled high-level voltage signal is generated at the pull-up node PU1 or the signal output terminal Gout during a frame, because the eighth transistor M8A and the eleventh transistor M11A are both normally turned on, the low-level signal will be input to the signal output terminal Gout to keep the signal from the signal output terminal Gout of the shift register normal).

Figure 3:
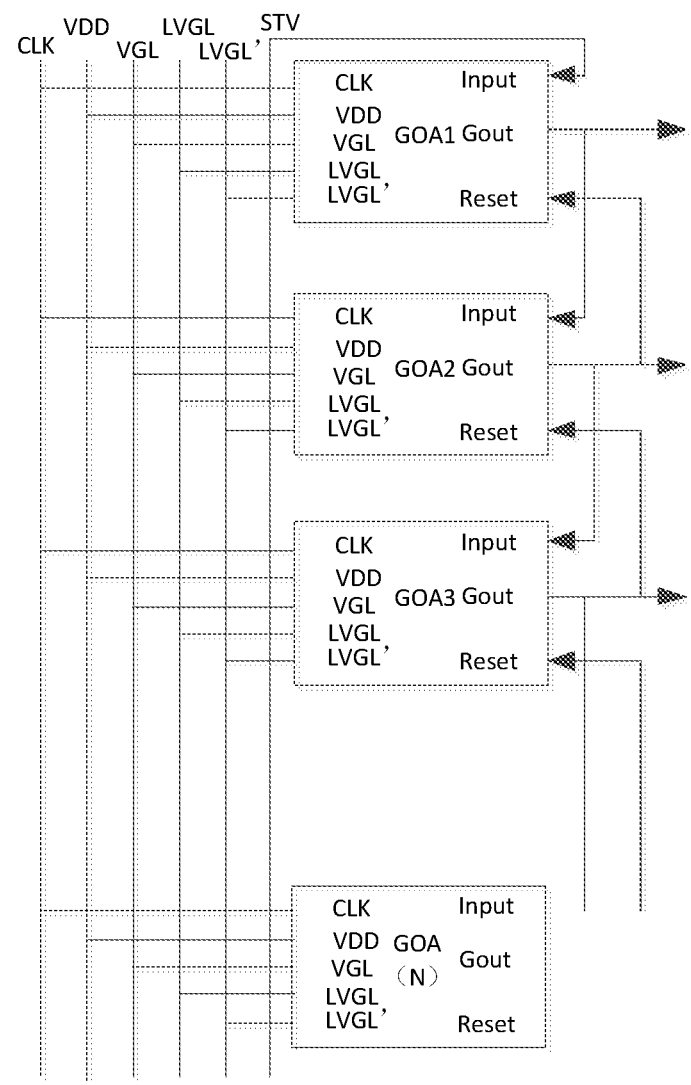
FIG. 3 is a schematic structural diagram of a gate drive circuit provided by an embodiment of the present disclosure.

In a second aspect, embodiments of the present disclosure provide a gate drive circuit. FIG. 3 is a schematic structural diagram of a gate drive circuit provided by an embodiment of the present disclosure. As shown in FIG. 3, the gate drive circuit includes a plurality of shift registers that are cascaded each being the shift register as described above. Except for the shift register of the first stage, the signal input terminal Input of the shift register of the current stage is coupled to the cascade signal output terminal Out_c of the shift register of the previous stage; the signal input terminal Input of the shift register of the first stage is coupled to a frame start signal STV. Except for the shift register of the last stage, the cascade signal output terminal Out_c of the shift register of the current stage is coupled to the reset signal terminal Reset of the shift register of the next stage. It should be noted that in the shift register according to the embodiments of the present disclosure, the signal output from the cascade signal output terminal Out_c is substantially the same as the signal output from the signal output terminal Gout, and therefore, the signal output from the cascade signal output terminal Out_c can be directly replaced by the signal output from the signal output terminal Gout for simplicity. In this case, except for the shift register of the first stage, the signal input terminal Input of the shift register of the current stage is coupled to the signal output terminal Gout of the shift register of the previous stage; the signal input terminal Input of the shift register of the first stage is coupled to a frame start signal STV. Except for the shift register of the last stage, the signal output terminal Gout of the shift register of the current stage is coupled to the reset signal terminal Reset of the shift register of the next stage, as shown in FIG. 3.

It should be noted that the shift register of the first stage and the shift register of the last stage are relative, and are determined according to the scanning sequence (forward scan or the reverse scan) of the gate drive circuit. When the gate drive circuit scans the gate lines in a forward direction, according to the scanning sequence of the gate lines, the shift register that provides the scanning signal to the first gate line is the shift register of the first stage, and the shift register that provides the scanning signal to the last gate line is the shift register of the last stage. When the gate drive circuit scans the gate lines in a reverse direction, according to the scanning sequence of the gate lines, the last gate line is supplied with the scanning signal first, therefore, the shift register that provides the scanning signal to the last gate line is the shift register of the first stage, and the shift register that provides the scanning signal to the first gate line is the shift register of the last stage.

In a third aspect, an embodiment of the present disclosure provides a display panel including the above-mentioned gate drive circuit. The implementation principle and technical effect thereof are the same as those of the gate drive circuit provided in any of the foregoing embodiments, and will not be repeated here.

It could be understood that the above implementations are merely exemplary implementations used to illustrate the principle of the present disclosure, but the present disclosure is not limited thereto. For those of ordinary skill in the art, various modifications and improvements can be made without departing from the spirit and essence of the present disclosure, and these modifications and improvements are also deemed to be within the protection scope of the present disclosure.

What is claimed is:

1. A shift register comprising: an input sub-circuit, an output sub-circuit, at least one pull-down control sub-circuit, at least one first pull-down sub-circuit, and at least one first control sub-circuit;
   wherein the input sub-circuit is coupled to a signal input terminal and a pull-up node, and is configured to pre-charge, in response to an input signal provided by the signal input terminal, the pull-up node by using the input signal; the pull-up node is a connection node between the input sub-circuit, the output sub-circuit and the first pull-down sub-circuit;
   the output sub-circuit is coupled to the pull-up node, a clock signal terminal and a signal output terminal, and is configured to output a clock signal provided by the clock signal terminal through the signal output terminal in response to a potential of the pull-up node;
   the pull-down control sub-circuit is coupled to a power supply voltage terminal and a pull-down node, and is configured to control, in response to a power supply voltage signal provided by the power supply voltage terminal, a potential of the pull-down node by using the power supply voltage signal; the pull-down node is a connection node between the pull-down control sub-circuit and the first pull-down sub-circuit;
   the first pull-down sub-circuit is coupled to the pull-up node, a first preset voltage terminal, and the pull-down node, and is configured to pull down the potential of the pull-down node by using a first preset voltage signal provided by the first preset voltage terminal in response to the potential of the pull-up node;
   the first control sub-circuit is coupled to the pull-down node, a second preset voltage terminal, and the pull-up node, and is configured to control the potential of the pull-up node by using a second preset voltage signal provided by the second preset voltage terminal in response to the potential of the pull-down node; a potential of the first preset voltage signal is lower than a potential of a non-operating level signal of the first pull-down sub-circuit, and a potential of the second preset voltage signal is lower than the potential of the first preset voltage signal;
   at least one second pull-down sub-circuit coupled to the signal input terminal, the first preset voltage terminal, and the pull-down node, and configured to pull down the potential of the pull-down node by using the first preset voltage signal provided by the first preset voltage terminal in response to the input signal provided by the signal input terminal; and
   at least one second control sub-circuit coupled to the pull-down node, the second preset voltage terminal, and the signal input terminal, and configured to control a potential of the signal input terminal by using the second preset voltage signal provided by the second preset voltage terminal in response to the potential of the pull-down node.

2. The shift register of claim 1, wherein the first pull-down sub-circuit comprises: a sixth transistor, and the first control sub-circuit comprises: a twelfth transistor;

the sixth transistor has a control electrode coupled to the pull-up node and a second electrode of the twelfth transistor, a first electrode coupled to the first preset voltage terminal, and a second electrode coupled to the pull-down node; and the twelfth transistor has a control electrode coupled to the pull-down node, a first electrode coupled to the second preset voltage terminal, and the second electrode coupled to the control electrode of the sixth transistor and the pull-up node.

3. The shift register of claim 1, wherein the second pull-down sub-circuit comprises: a seventh transistor, and the second control sub-circuit comprises: a thirteenth transistor;

the seventh transistor has a control electrode coupled to the signal input terminal and a second electrode of the thirteenth transistor, a first electrode coupled to the first preset voltage terminal, and a second electrode coupled to the pull-down node; and the thirteenth transistor has a control electrode coupled to the pull-down node, a first electrode coupled to the second preset voltage terminal, and the second electrode coupled to the control electrode of the seventh transistor and the signal input terminal.

4. The shift register of claim 1, further comprising: at least one first noise reduction sub-circuit and at least one second noise reduction sub-circuit;

wherein the first noise reduction sub-circuit is coupled to the pull-down node, a non-operating level signal terminal, and the pull-up node, and is configured to denoise the potential of the pull-up node by using a non-operating level signal provided by the non-operating level signal terminal in response to the potential of the pull-down node; and the second noise reduction sub-circuit is coupled to the pull-down node, the non-operating level signal terminal, and the signal output terminal, and is configured to denoise a potential of the signal output terminal by using the non-operating level signal provided by the non-operating level signal terminal in response to the potential of the pull-down node.

5. The shift register of claim 4, wherein the first noise reduction sub-circuit comprises: an eighth transistor, and the second noise reduction sub-circuit comprises: a tenth transistor and an eleventh transistor;

the eighth transistor has a control electrode coupled to the pull-down node, a first electrode coupled to the non-operating level signal terminal, and a second electrode coupled to the pull-up node;

the tenth transistor has a control electrode coupled to the pull-down node, a first electrode coupled to the non-operating level signal terminal, and a second electrode coupled to a cascade signal output terminal; and the eleventh transistor has a control electrode coupled to the pull-down node, a first electrode coupled to the non-operating level signal terminal, and a second electrode coupled to the signal output terminal.

6. The shift register of claim 1, further comprising: a first reset sub-circuit and a second reset sub-circuit;

wherein the first reset sub-circuit is coupled to a reset signal terminal, a non-operating level signal terminal, and the pull-up node, and is configured to reset the potential of the pull-up node by using a non-operating level signal provided by the non-operating level signal terminal in response to a potential of a reset signal provided by the reset signal terminal; and the second reset sub-circuit is coupled to the reset signal terminal, the non-operating level signal terminal, and the signal output terminal, and is configured to reset a potential of the signal output terminal by using the non-operating level signal provided by the non-operating level signal terminal in response to the potential of the reset signal provided by the reset signal terminal.

7. The shift register of claim 6, wherein the first reset sub-circuit comprises: a second transistor, and the second reset sub-circuit comprises: a fourth transistor;

the second transistor has a control electrode coupled to the reset signal terminal, a first electrode coupled to the non-operating level signal terminal, and a second electrode coupled to the pull-up node; and the fourth transistor has a control electrode coupled to the reset signal terminal, a first electrode coupled to the non-operating level signal terminal, and a second electrode coupled to the signal output terminal.

8. The shift register of claim 1, wherein the input sub-circuit comprises: a first transistor;

the first transistor has a control electrode and a first electrode both coupled to the signal input terminal, and a second electrode coupled to the pull-up node.

9. The shift register of claim 1, wherein the output sub-circuit comprises: a third transistor, a ninth transistor, and a storage capacitor;

the third transistor has a control electrode coupled to the pull-up node, a first electrode coupled to the clock signal terminal, and a second electrode coupled to the signal output terminal;

the ninth transistor has a control electrode coupled to the pull-up node, a first electrode coupled to the clock signal terminal, and a second electrode coupled to a cascade signal output terminal; and the storage capacitor has a first terminal coupled to the pull-up node, and a second terminal coupled to the signal output terminal.

10. The shift register of claim 1, wherein the pull-down control sub-circuit comprises: a fifth transistor;

the fifth transistor has a control electrode and a first electrode both coupled to the power supply voltage terminal, and a second electrode coupled to the pull-down node.

11. The shift register of claim 1, wherein numbers of the at least one pull-down control sub-circuit, the at least one first pull-down sub-circuit, and the at least one first control sub-circuit are equal.

12. The shift register of claim 11, wherein numbers of the at least one pull-down control sub-circuit, the at least one first pull-down sub-circuit, the at least one first control sub-circuit, the at least one second pull-down sub-circuit and the at least one second control sub-circuit are equal.

13. The shift register of claim 12, wherein numbers of the at least one pull-down control sub-circuit, the at least one first pull-down sub-circuit, the at least one first control sub-circuit, the at least one second pull-down sub-circuit, the at least one second control sub-circuit, the at least one first noise reduction sub-circuit and the at least one second noise reduction sub-circuit are equal.

14. The shift register of claim 13, wherein the numbers of the at least one pull-down control sub-circuit, the at least one first pull-down sub-circuit, the at least one first control sub-circuit, the at least one second pull-down sub-circuit, the at least one second control sub-circuit, the at least one first noise reduction sub-circuit and the at least one second noise reduction sub-circuit are all two.

15. The shift register of claim 14, wherein the two pull-down control sub-circuits operate asynchronously.

16. A gate drive circuit, comprising a plurality of shift registers that are cascaded, and each shift register being the shift register of claim 1.

17. The gate drive circuit of claim 16, wherein the signal input terminal of a shift register of a current stage is coupled to the signal output terminal of a shift register of a previous stage; and the signal output terminal of the shift register of the current stage is coupled to a reset signal terminal of a shift register of a next stage.

18. A display panel, comprising the gate drive circuit of claim 16.

* * * * *